(12) United States Patent
Lee et al.

(10) Patent No.: US 8,810,996 B2
(45) Date of Patent: Aug. 19, 2014

(54) INKJET-PRINTED FLEXIBLE ELECTRONIC COMPONENTS FROM GRAPHENE OXIDE

(75) Inventors: Woo Young Lee, Ridgewood, NJ (US); Linh Le, New York, NY (US); De Kong, Hoboken, NJ (US); Matthew Henderson Ervin, Clarksville, MD (US); James L. Zunino, III, Boonton Township, NJ (US); Brian E. Fuchs, Hackettstown, NJ (US)

(73) Assignees: The Trustees of the Stevens Institute of Technology, Hoboken, NJ (US); The United States of America, as represented by the Secretary of the Army, Washington, DC (US)

( * ) Notice: Subject to any disclaimer, the term of this patent is extended or adjusted under 35 U.S.C. 154(b) by 170 days.

(21) Appl. No.: 13/301,124

(22) Filed: Nov. 21, 2011

(65) Prior Publication Data

US 2012/0170171 A1     Jul. 5, 2012

Related U.S. Application Data (60) Provisional application No. 61/416,062, filed on Nov. 22, 2010.

(51) Int. Cl.
| | |
|---|---|
| *H01G 9/00* | (2006.01) |
| *H05K 3/12* | (2006.01) |
| *H01G 11/36* | (2013.01) |
| *H01G 11/86* | (2013.01) |
| *H05K 1/16* | (2006.01) |
| *H05K 1/03* | (2006.01) |
| *H05K 1/09* | (2006.01) |

(52) U.S. Cl.
CPC ............. *H01G 11/36* (2013.01); *H05K 3/125* (2013.01); *H05K 1/0393* (2013.01); *H05K 1/092* (2013.01); *Y02E 60/13* (2013.01); *H01G 11/86* (2013.01); *H05K 1/162* (2013.01); *H05K 2201/0323* (2013.01)
USPC ........... 361/502; 361/503; 361/504; 361/509; 361/512; 361/525

(58) Field of Classification Search
USPC ......... 361/502, 503, 504, 512, 516–519, 305, 361/311–313
See application file for complete search history.

(56) References Cited

U.S. PATENT DOCUMENTS

| | | | |
|---|---|---|---|
| 7,167,355 B2 * | 1/2007 | Chen | 361/508 |
| 7,852,613 B2 * | 12/2010 | Ma et al. | 361/503 |
| 8,098,482 B2 * | 1/2012 | Clelland et al. | 361/502 |
| 8,206,469 B2 * | 6/2012 | Chiang et al. | 29/623.1 |
| 2011/0042813 A1 | 2/2011 | Crain et al. | |
| 2011/0052813 A1 | 3/2011 | Ho et al. | |

OTHER PUBLICATIONS

An et al., Optical and Sensing Properties of 1-Pyrenecarboxylic Acid-Functionalized Graphene Films Laminated on Polydimethylsiloxane Membrane, American Chemical Society, vol. 5, No. 2, (2011), pp. 1003-1011.
Le et al., Graphene supercapacitor electrodes fabricated by inkjet printing and thermal reduction of graphene oxide, Electrochemistry Communications, vol. 13, (2011), pp. 355-358.
Le et al., Inkjet-Printed Graphene for Flexible Micro-Supercapacitors, IEEE International Conference on Nanotechnology, Aug. 15-18, 2011, Portland, Oregon, USA, pp. 67-71.
Huang et al., Graphene-Based Conducting Inks for Direct Inkjet Printing of Flexible Conductive Patterns and Their Applications in Electric Circuits and Chemical Sensors, Nano Res, (2011) 9 pages.
Jacoby, Graphene Moves Toward Applications, www.cen-online.org, Nov. 21, 2011, pp. 10-15.

* cited by examiner

*Primary Examiner* — Nguyen T Ha
(74) *Attorney, Agent, or Firm* — Greenberg Traurig, LLP (57) ABSTRACT

An electrical component includes an inkjet-printed graphene electrode. Graphene oxide flakes are deposited on a substrate in a graphene oxide ink using an inkjet printer. The deposited graphene oxide is thermally reduced to graphene. The electrical properties of the electrode are comparable to those of electrodes made using activated carbon, carbon nanotubes or graphene made by other methods. The electrical properties of the graphene electrodes may be tailored by adding nanoparticles of other materials to the ink to serve as conductivity enhancers, spacers, or to confer pseudocapacitance. Inkjet-printing can be used to make graphene electrodes of a desired thickness in preselected patterns. Inkjet printing can be used to make highly-transparent graphene electrodes. Inkjet-printed graphene electrodes may be used to fabricate double-layer capacitors that store energy by nanoscale charge separation at the electrode-electrolyte interface (i.e., "supercapacitors").

9 Claims, 6 Drawing Sheets

INKJET-PRINTED FLEXIBLE ELECTRONIC COMPONENTS FROM GRAPHENE OXIDE

CROSS-REFERENCE TO RELATED APPLICATIONS

The present application claims the benefit of U.S. Provisional Patent Application No. 61/416,062, filed Nov. 22, 2010, which is incorporated by reference herein in its entirety.

STATEMENT REGARDING FEDERALLY SPONSORED RESEARCH

Certain technology disclosed herein was derived from research supported by the U.S. Government as part of Task Order #58, "Nano-RDX Self-Assembly for Multipoint Microinitiators," and Task Order #76, "Integrated Electronics and Energetics," of Contract W15QKN-05-D-0011. The invention described herein may be manufactured, used, and licensed by or for the U.S. Government for U.S. Government purposes.

BACKGROUND OF THE INVENTION

Continuing advances in miniaturizing electronic devices have resulted in an increased demand for rechargeable power sources that have long cycle life and can be rapidly charged. The life time of rechargeable batteries is limited to less than thousands of cycles due to the reduction-oxidation (redox) reactions which induce constant expansion-contraction of battery electrodes during charge/discharge cycles and consequently cause their deterioration over time. Also, with electrochemical energy stored in batteries delivered by the means of volumetric redox reactions, the charge/discharge rate and specific power of the best available lithium-ion batteries are limited by the slow rate of solid-state diffusion.

Electronic double-layer capacitors, commonly referred to as "supercapacitors", are promising prospects for overcoming the life-time and power-density limitations of present rechargeable batteries. These supercapacitors store energy by nanoscale charge separation at the electrode-electrolyte interface. This charge storage mechanism involves no chemical reaction with the electrodes, and consequently results in fast charge/discharge rates in seconds while being able to withstand millions of charge/discharge cycles.

In order to obtain high energy density, supercapacitor electrodes are generally fabricated from electrically conductive materials having the high surface areas necessary for charge separation and storage at the electrode-electrolyte interface. Carbonaceous materials such as activated carbon are most commonly used. Recently, there has been interest in exploring carbon nanotubes (CNT) and graphene as electrode materials because of their high theoretical surface areas of 1320 $m^2/g$ and 2630 $m^2/g$, respectively, and high electrical conductivity. CNT- and graphene-based supercapacitors have been demonstrated to possess high capacitance and fast charge/discharge characteristics. However, with regard to inkjet-printing these nanomaterials for practical applications, CNT and graphene suffer from: (1) high costs; (2) lack of commercial availability in large quantities, particularly for graphene; and, most importantly, (3) their tendency to aggregate in pure water due to their hydrophobic nature, even at very low concentrations of 5 ppm. The addition of surfactants can increase the stability of CNT and graphene dispersion, but most surfactants are found to have detrimental effects on capacitance.

SUMMARY OF THE INVENTION

The present invention provides inkjet-printed graphene electrodes comprising layered graphene flakes as an electrically-conductive medium. The present invention also provides flexible electrical components comprising such electrodes. The present invention also provides methods of fabricating such electrodes by inkjet-printing and subsequent thermal reduction of a water-based graphene oxide ink.

In an embodiment of the present invention, suitable graphene inks are prepared by suspending commercially available graphene oxide flakes (i.e., single molecular layers of graphene oxide) into pure water under ultrasonic conditions to form stable dispersions of graphene oxide flakes.

In other embodiments of the present invention, a graphene oxide ink is jetted using a commercial inkjet printer to deposit and pattern graphene oxide electrodes in any thickness, with minimum lateral resolutions of about 50 µm. According to embodiments of the present invention, graphene oxide can be printed on any of a variety of surfaces, including plastics, metal foils, and other materials. In some such embodiments, the printed graphene oxide is thermally reduced after printing at moderate temperatures of in the range of about 140° C. to about 800° C. in an inert environment for a period of time in the range of about 4 hours to about 12 hours to increase the electrical conductivity of the printed graphene oxide electrode. In other such embodiments of the invention, the printed graphene oxide is photothermally reduced for a few minutes in air.

In some embodiments of the present invention, the power and energy densities of such inkjet-printed graphene electrodes are comparable to those of commercial activated carbon-based electrodes.

In some other embodiments of the present invention, the inkjet-printed graphene electrodes have porous structures with bi-modal pore size distribution. In some such embodiments the pore sizes are about 2 nm and about 20 nm.

In further embodiments of the invention, a graphene oxide ink is tailored by adding nanoparticles of materials such as metal nanoparticles, metal oxides nanoparticles or polymers to the ink to serve as conductivity enhancers, pseudo-capacitive materials and/or and physical nanospacers. Such additives are used to modify the electrical properties of the inkjet-printed graphene.

In yet further embodiments of the invention, the inkjet-printed graphene electrodes are incorporated into electronic components. In some such embodiments, the electronic components are supercapacitors. In some such embodiments, the electronic components are batteries. In some such embodiments, the electronic components are components of initiators for explosive devices. In some such embodiments, the electronic components are conductive spirals that mimic the two-dimensional ("2D") induction coils used in wireless transmitting technology.

In some embodiments of the invention, the spacing of the ink droplets is controlled during inkjet printing so as to produce functional graphene electrodes having selected degrees of transparency and/or sheet resistance. In some embodiments of the invention, such transparent electrodes are incorporated into solar cells or other optoelectronic devices.

BRIEF DESCRIPTION OF THE FIGURES

For a better understanding of the present invention, reference is made to the following detailed description of the exemplary embodiments considered in conjunction with the accompanying drawings, in which.

DETAILED DESCRIPTION OF THE INVENTION

The following detailed description of the invention includes a discussion of exemplary embodiments of inkjet-printed graphene electrodes, methods for producing such inkjet-printed graphene electrodes, and electronic devices incorporating such inkjet-printed graphene electrodes. It will be understood by those having ordinary skill in the relevant arts that many variations and modifications may be made to these exemplary embodiments without departing from the spirit and scope of the invention.

The recent development of methods for producing large quantities of hydrophilic graphene oxide at reasonable prices presents a unique opportunity for the use of graphene oxide as an ink for scalable inkjet-printing in terms of printing speed and process robustness. Just like graphene, graphene oxide has very high specific surface area. Although graphene oxide has a low electrical conductivity, it can be thermally or chemically reduced to increase electrical sheet conductance to levels comparable to those achieved with pristine graphene films. Therefore, it is anticipated that inkjet-printed and thermally reduced graphene oxide may serve as conformal, scalable and economically viable supercapacitor electrodes, particularly for flexible energy storage devices in miniature power applications, as well as other electronic components.

In a method of producing an inkjet-printed graphene according to an exemplary embodiment of the present invention, a commercially-available inkjet printer (i.e., a FUJIFILM Dimatix Materials Printer, DMP2800) was used to print and pattern graphene oxide from a graphene oxide ink onto a substrate in a controllable manner. Other makes and models of inkjet printers may be used in embodiments of the present invention.

The exemplary inkjet printer utilizes microfabricated piezoelectric nozzles for on-demand and programmable generation of 1 or 10 picoliter (pl) microscopic ink droplets with minimum spatial resolutions of about 20 to 50 μm. Each 10 pl droplet, upon hitting the substrate and drying, produces somewhat disc-shaped features with diameters of about 50 μm. The printing step can be repeated to increase thickness of the graphene layer.

Figure 1:
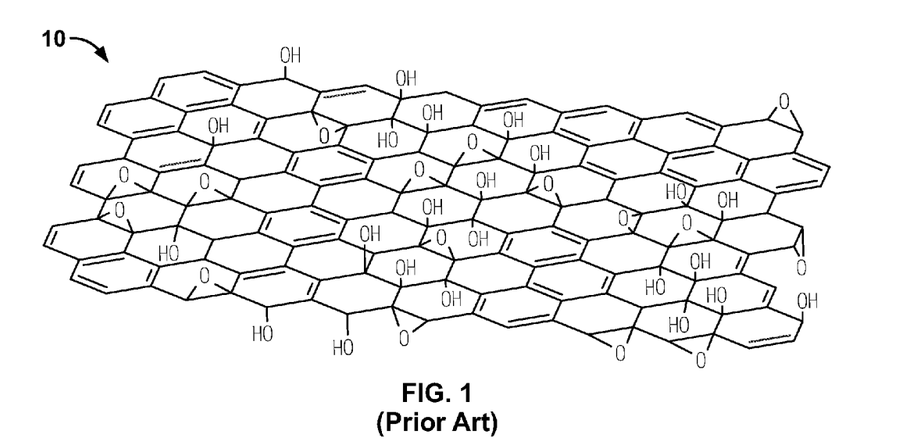
FIG. 1 is a diagram of a typical chemical structure of graphene oxide.
Figure 2:
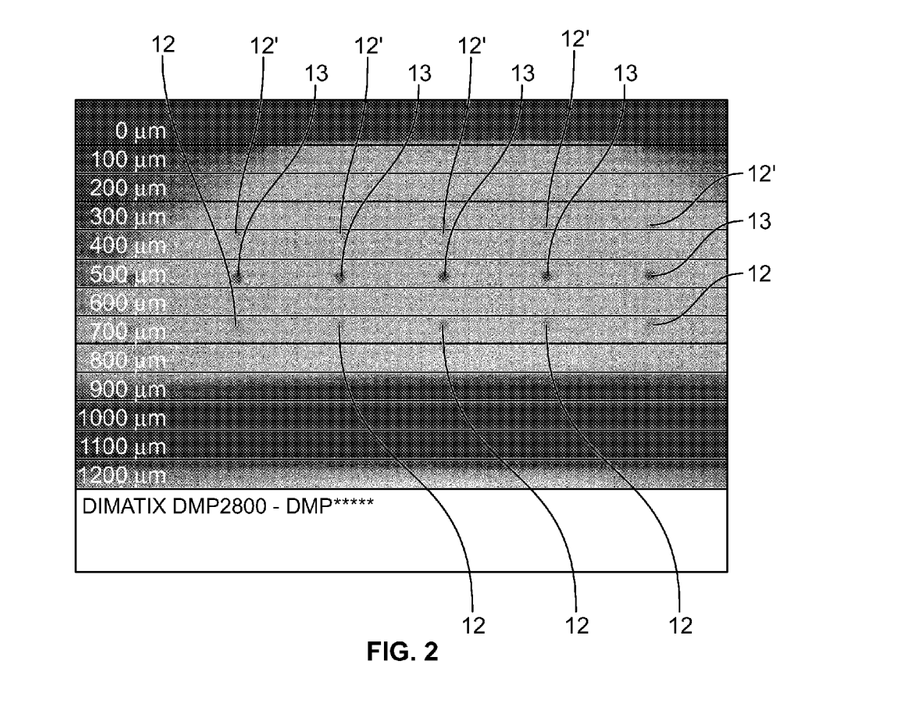
FIG. 2 is a microphotograph of spherical ink droplets deposited by a conventional inkjet printer according to a method of the present invention.

The graphene oxide ink used in the present example was prepared by suspending a commercially obtained graphene oxide (Cheaptubes, Inc., Brattleboro, Vt. 05301 USA) into pure water under ultrasonic conditions at a concentration of 0.2 wt %. The graphene oxide was in the form of single molecular layers (hereinafter referred to as "flakes") having lateral dimensions in the range of about 0.2 μm and 0.8 μm. An example of the structure of graphene oxide 10 is shown as FIG. 1. The water-based graphene oxide ink was stable for months, mostly due to the hydroxyl, epoxide and carboxyl (not shown) functional groups naturally present on the surface of graphene oxide. Water-based inks having up to 1 wt % graphene oxide may also be used, but stability decreases at higher graphene oxide concentrations. At room temperature, the viscosity and surface tension of the 0.2 wt % water-based graphene oxide ink were measured to be 1.06 mPa·s and 72 mN/m, similar to those of deionized water (e.g., 0.99 mPa·s and 72 mN/m). These properties of the ink were outside of the ranges of recommended for normal inkjet printing (e.g., 10-12 mPa·s and 28-32 mN/m). However, after routine experimentation with the voltage of the piezoelectric nozzles of the inkjet printer as a function of time, the inkjet process was effective in consistently generating and printing spherical ink droplets at a lateral spatial resolution of about 50 μm, without clogging the nozzles. FIG. 2 shows such ink droplets 12, their images 12' reflected in a substrate, and images 13 of the inkjet nozzle. The droplets 12 were repeatedly deposited at precise locations. For example, FIGS. 3 and 4 show inkjet-printed graphene oxide dots 14 that were deposited using 20 printing passes.

Figure 3:
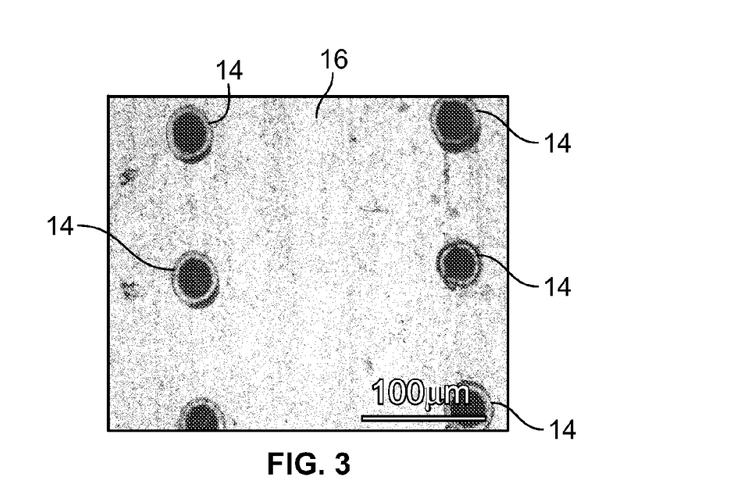
FIG. 3 is a microphotograph of graphene oxide dots formed on a substrate by evaporation of solvent from ink drops deposited by a conventional inkjet printer according to a method of the present invention.
Figure 4:
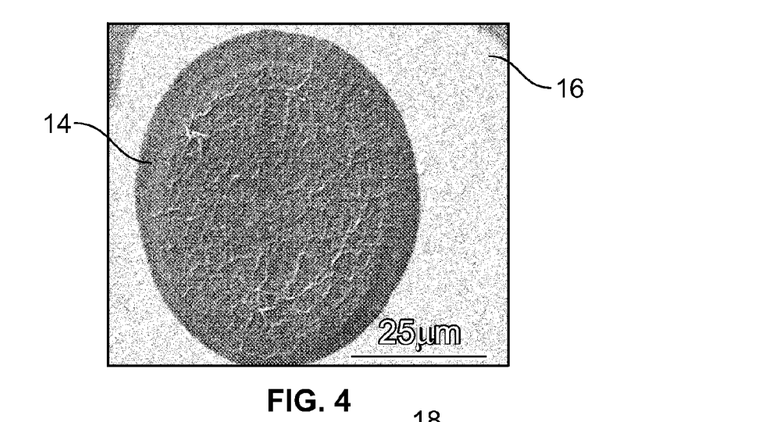
FIG. 4 is an enlargement of a portion of FIG. 3 showing the scale of one graphene oxide dot of the type shown in FIG. 3.
Figure 5:
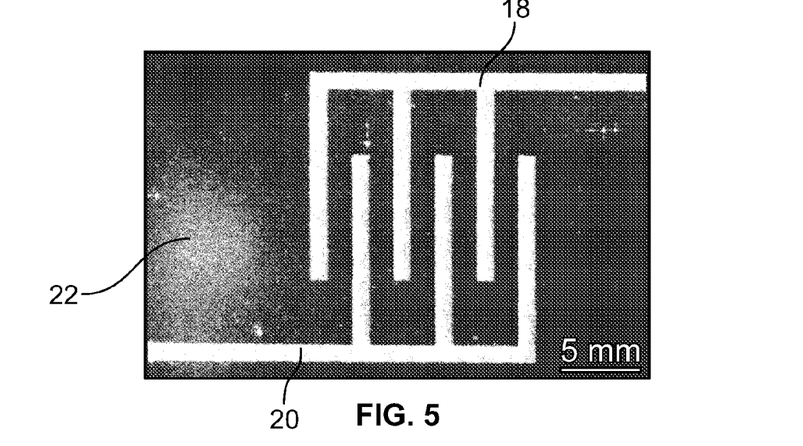
FIG. 5 is a microphotograph of two exemplary inkjet-printed graphene electrodes on a substrate according to an embodiment of the present invention.

Continuing to refer to FIGS. 3 and 4, each graphene oxide dot 14 is a disc-shaped micropattern feature formed by the liquid ink droplet upon hitting the substrate 16 and losing solvent by evaporation. In exemplary embodiments of the present invention, and as illustrated in FIG. 5, such droplets were overlapped to: (1) produce a cross-finger, interdigitated configuration of two graphene oxide electrodes 18, on a flexible polymer substrate 22 (Kapton® polyimide film, E.I. du Pont de Nemours and Company, USA) and (2) highlight lateral pattern resolutions at the micron length scales. Such an electrode configuration is suitable for fabrication of supercapacitors. Graphene oxide electrodes, such as electrodes 18, 20 and electrodes having other shapes and thicknesses, can be inkjet-printed on any substrate surface, including Kapton®, silver, silicon, nickel, and titanium, depending on the electrical, mechanical or chemical properties desired. The pattern thickness can be increased, if necessary, by repeating the number of printing passes so as to overlay droplets according to the pattern. The lateral resolution of the patterns shown in FIG. 5 was about 50 μm. The thickness of the graphene oxide deposit can also be controlled by varying droplet sizes and lateral spacing of the droplets.

In a demonstration of the performance of inkjet-printed graphene electrodes of the present invention, graphene oxide was inkjet-printed onto a titanium (Ti) substrate using 100 printing passes. The inkjet-printed graphene oxide printed on the Ti foil was then reduced at 200° C. in $N_2$ atmosphere for 12 hours to increase the electrical conductivity of the printed material. The printed graphene oxide electrode transitioned from electrically insulating to electrically conducting, as measured by a voltmeter, after the reduction step.

The temperature and time of the reduction process should be selected to be compatible with the substrate material and other conformal materials to be used in fabricating the flexible electronic components. The degree of thermal reduction may also be tuned to achieve the desired specific capacitance through control of the functional groups attached to the graphene oxide flake and through the wetting properties of the graphene ink. Transitions from electrically-insulating graphene oxide to electrically-conducting graphene are also observed after photothermal reduction of the graphene oxide. Such photothermal reduction can be achieved by irradiating the inkjet-printed graphene oxide for a few minutes in air with a simple infrared heat lamp of a type commonly available at a retail hardware store.

Figure 6:
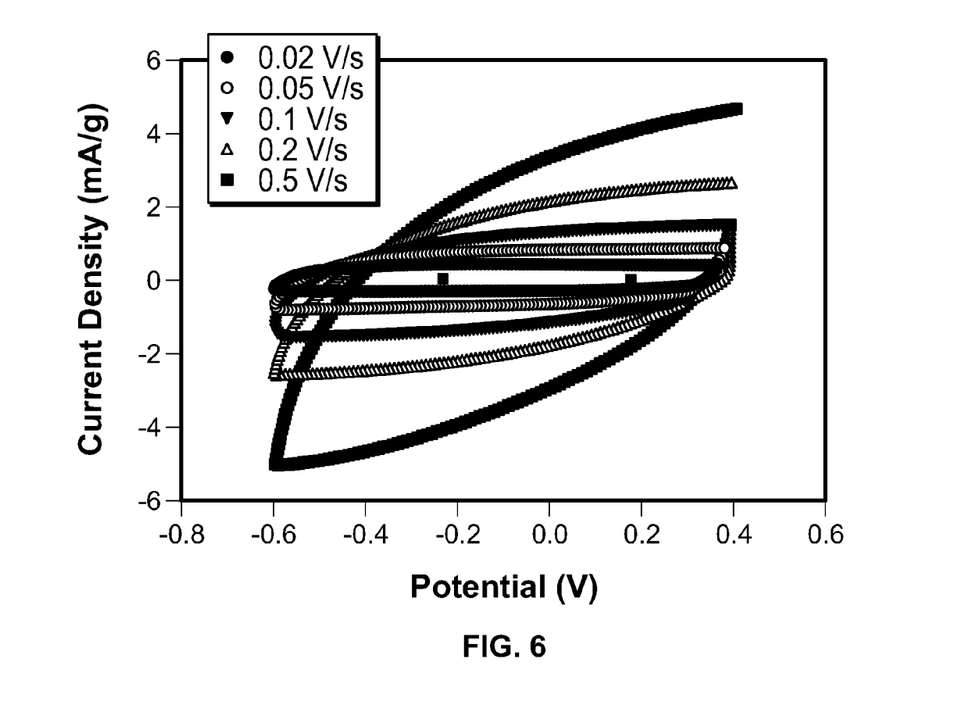
FIG. 6 is a cyclic voltammetry plot of the current density/potential function of two clamped inkjet-printed graphene electrodes on a substrate according to another embodiment of the present invention.
Figure 7:
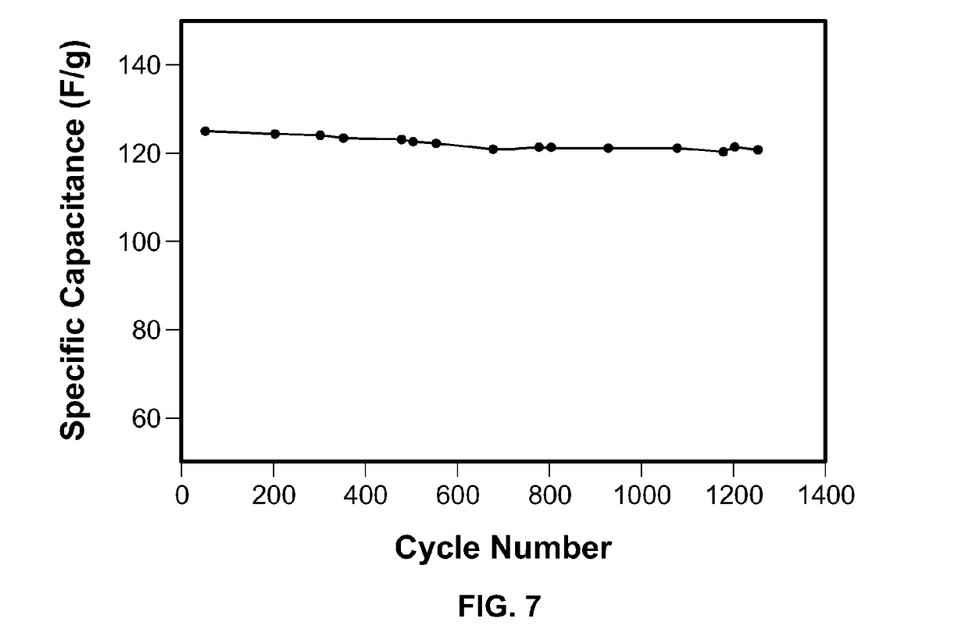
FIG. 7 is a plot of the specific capacitance of the electrodes of FIG. 6 against number of charge/discharge cycles.
Figure 8:
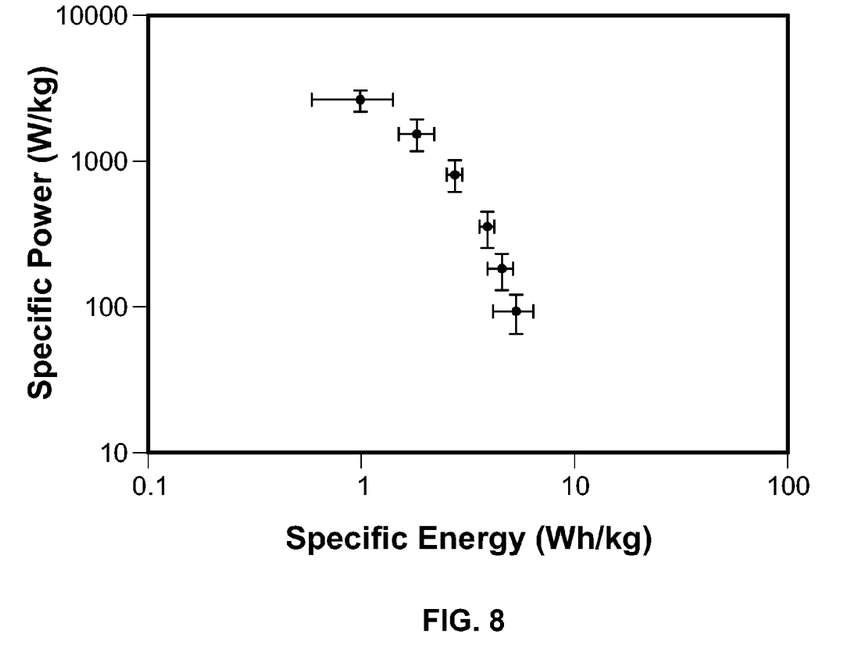
FIG. 8 is a Ragone plot of the specific power against the specific energy of the electrodes of FIG. 6.

After thermal reduction, the graphene electrodes on Ti were clamped in a block of Teflon® fluoropolymer (E.I. duPont de Nemours and Company, USA) using a Celgard 3401® (Celgard, LLC, Charlotte, N.C. 28273 USA) membrane as a separator and 1 M $H_2SO_4$ electrolyte in order to make cyclic voltammetry (CV) and constant-current charge/discharge measurements as a full-cell, although unpackaged, device. As shown in FIG. 6, the graphene electrodes exhibited fairly rectangular CV curves at scan rates in the range of 0.01 to 0.5 V/s, showing capacitive behavior. The specific capacitance decreased from 126 to 120 F/g over 1000 CV cycles at a constant scan rate of 50 mV/s (FIG. 7) demonstrating 95% capacitance retention. The charging/discharging curves were fairly linear (not shown). This capacitance compares well with those reported for other carbonaceous electrode materials such as carbon nanotubes, CVD graphene and activated carbon. Also, the specific capacitance was measured to be 48 to 132 F/g in the scan range of 0.5 to 0.01 V/s (not shown). The discharge slopes of the charge/discharge curves were used to estimate the specific energy and power density (per graphene mass only) shown in the Rangone plot (FIG. 8). A comparison of selected properties of graphene made by powder methods and printed graphene is presented in Table 1, below.

TABLE 1

Performance of Graphene from Two Sources

|  | Graphene (powder methods) | Printed Graphene |
|---|---|---|
| Capacitance (F/g) | about 100 about 117 | 132 |
| Energy Density (Wh/kg) | 4.1 | 6.74 |
| Power Density (kW/kg) | 10 | 2.19 |

The electrical properties of the inkjet-printed graphene electrode, including power and energy densities, may be further improved by modifying the graphene oxide ink with nanoparticles that can serve as conductivity enhancers and/or physical spacers in the electrode. These nanoparticles may also contribute energy storage through pseudocapacitance. Such materials may include metal oxides or electrically-conductive organic polymers, among others. For example, a water-based graphene oxide ink, as disclosed above, was modified by addition of ruthenium oxide ($RuO_2$) nanoparticles. A suspension of such nanoparticles was prepared using a simple solution-based precipitation method in which a KOH solution was added to a $RuCl_3$ solution with a stabilizing agent to reach a pH value of 7. The size of the $RuO_2$ nanoparticles was about 10 nm and was tunable by controlling synthesis conditions. The suspension was able to pass a 450 nm filter and was stable due to the high surface ζ-potential of the $RuO_2$ nanoparticles. By mixing the graphene oxide suspension and the $RuO_2$ nanoparticle suspension at an appropriate ratio, a stable ink containing both graphene oxide and $RuO_2$ was formulated. Appropriate ratios and sizes of the $RuO_2$ nanoparticles may be determined experimentally to achieve desirable electrode properties. The graphene oxide-$RuO_2$ ink was printable, and was used to fabricate a graphene+$RuO_2$ composite electrode on a nickel (Ni) foil using a printing and reduction method disclosed above. In the electrode, the $RuO_2$ nanoparticles served as physical spacers to keep the molecular layers of graphene oxide open, increasing the porosity of the graphene element and access for electrolyte ions. Ruthenium oxide is also a well known pseudocapacitive material. In comparison to the graphene printed on Ni, the graphene oxide+$RuO_2$ electrode increased both the surface area and capacitance of the graphene by a factor of about two, as summarized in Table 2 below. These results demonstrate the effectiveness of adding the $RuO_2$ nanoparticles to increase the electrochemical performance of the inkjet-printed graphene electrode. Other spacers, such as other metal nanoparticles, metal oxides nanoparticles or electrically-conductive organic polymers, may also be added to the graphene oxide ink to increase the porosity and/or pseudocapacitance of the finished graphene electrode.

TABLE 2

Comparison of Physical Properties of Inkjet-Printed Graphene from Two Different Water-Based Inks

|  | Graphene with $RuO_2$ nanoparticles | Graphene without $RuO^2$ nanoparticles |
|---|---|---|
| Surface area (m²/g) | 432 | 178 |
| Specific capacitance (F/g) | 26 | 13 |

Figure 9:
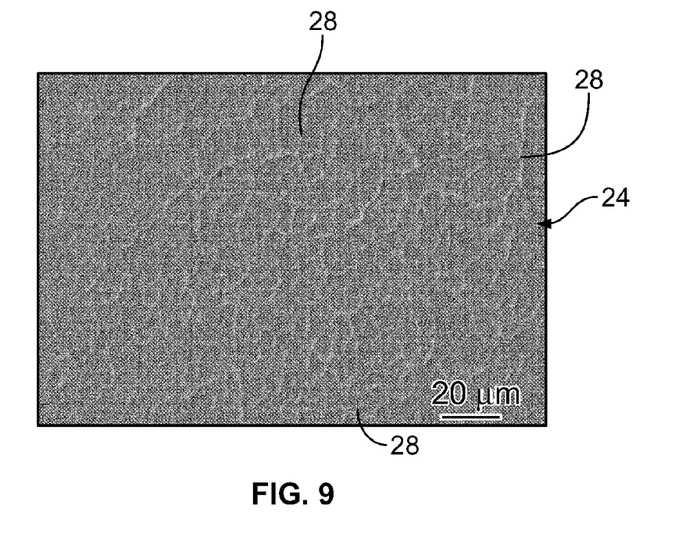
FIG. 9 is a scanning electron microscopic graph (SEM) of the top surface of a 100-pass inkjet-printed graphene structure showing corrugations in the graphene structure made according to an embodiment of the present invention.
Figure 10:
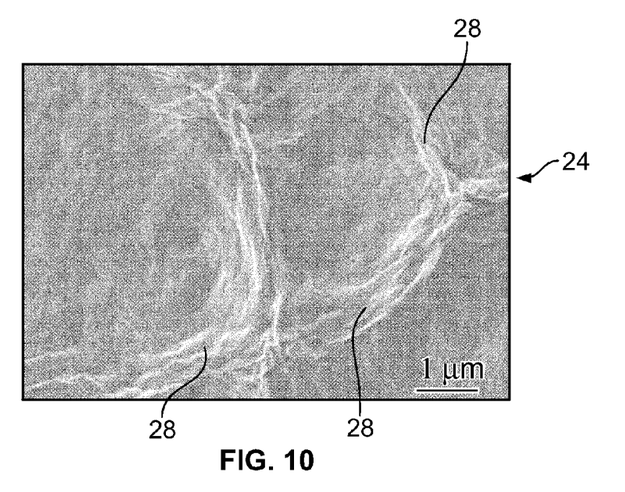
FIG. 10 is an enlargement of a portion of the SEM of FIG. 9.
Figure 11:
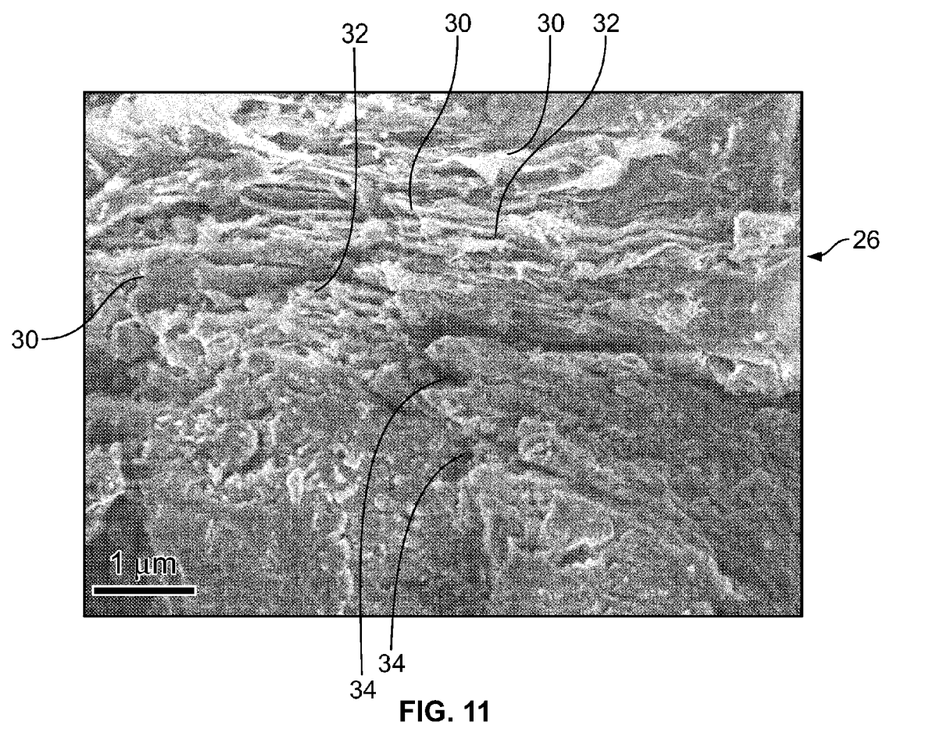
FIG. 11 is a SEM of a cross-section of a 100-pass inkjet-printed graphene structure made according to an embodiment of the present invention, showing porous and layered structures.

The inkjet-printed graphene of the present invention has an inherent porosity that may be a result of the manner in which the graphene structures are assembled (i.e., by overlapping graphene oxide dots or droplets). FIGS. 9, 10 and 11 are SEM images of 100-pass inkjet-printed graphene structures 24, 26. FIGS. 9 and 10 are top planar views of a 100-pass structure 24 at scales of 20 μm and 1 μm, respectively, showing corrugations 28. FIG. 11 is a cross-sectional view of a 100-pass structure 26 showing graphene layers, such as graphene layers 30, and micropores and mesopores, such as micropores 32 and mesopores 34, associated with corrugations. Without intending to be bound by theory, corrugations may be formed by folding and overlapping of the graphene oxide flakes when the ink droplets are deposited and dried, or by deformation of the layers as graphene oxide is reduced to graphene during the thermal or photothermal reduction step.

Figure 12:
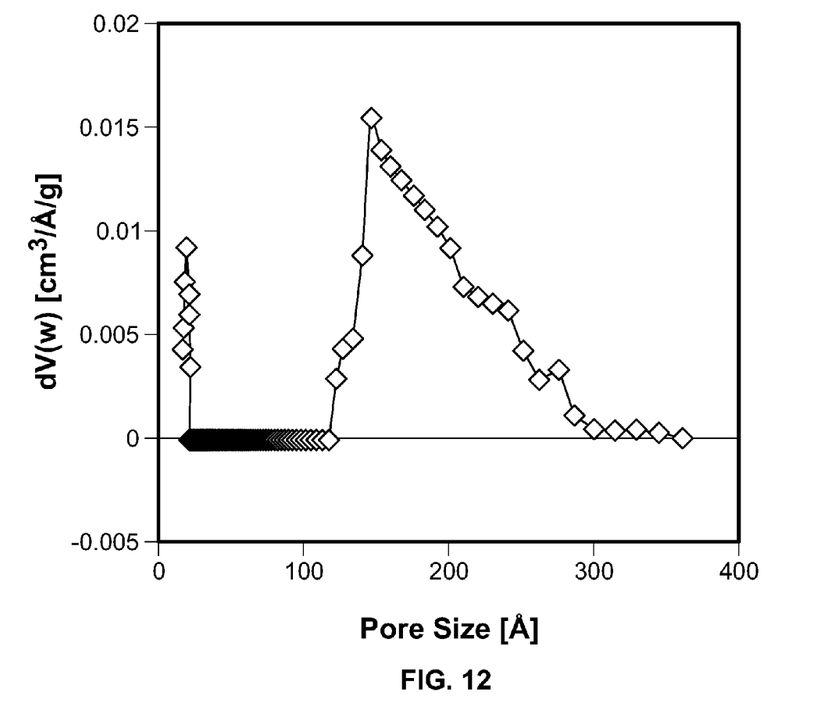
FIG. 12 is a plot of the pore size distribution in a 100-pass inkjet-printed graphene structure made according to an embodiment of the present invention.

Porosity analysis of 100-pass inkjet-printed graphene structures, which did not include additional nanoparticles, revealed that the structures were highly porous and had a bimodal distribution of pores, divided into micropores having sizes of about 1.5-2.2 nm and mesopores having sizes of about 11-36 nm. FIG. 12 is a plot of the pore size distribution. It may be noted that the ranges of pore sizes are rather narrow. The distribution of surface area and specific volume of the graphene structures among the types of pores is summarized in Table 3, below. Analyses were performed using standard methods, including nitrogen isotherm adsorption and BET methods for surface area estimates and the BJH model for pore size distribution analysis. As discussed above, increasing the porosity of the graphene structures can be used to improve their power and energy density. One method (i.e., the addition of spacers to the ink) was discussed above. Another method is to etch the graphene structure with a caustic reagent (e.g., potassium hydroxide (KOH) solution).

TABLE 3

Distribution of Surface Area and Volume Relative to Pore Size

|  | Total | Micropores (1.5-2.2 nm) | Mesopores (11-36 nm) |
|---|---|---|---|
| Surface area ($m^2/g$) | 282 | 140 | 142 |
| Volume ($cm^3/g$) | 1.36 | 0.0846 | 1.27 |

Figure 13:
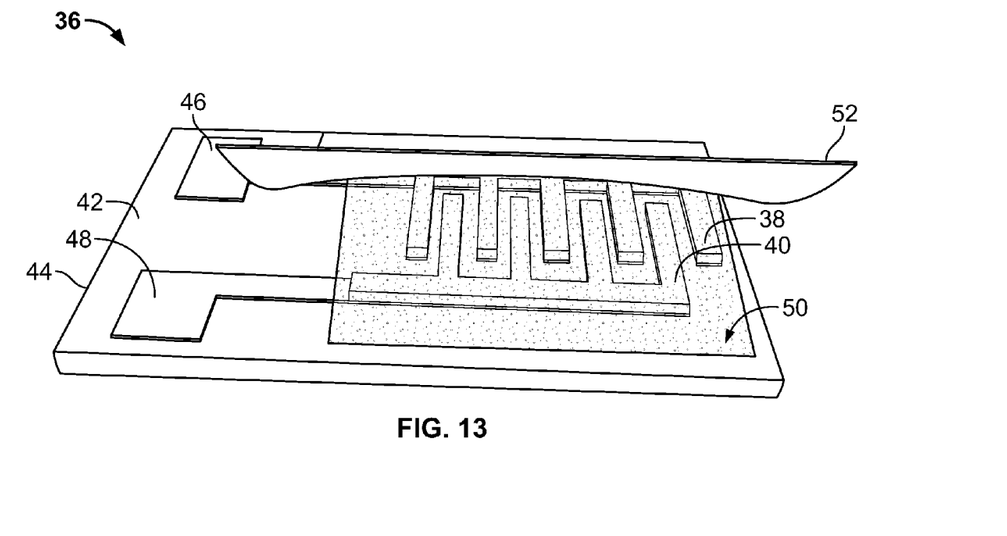
FIG. 13 is a schematic diagram of a conceptual design for a supercapacitor having inkjet-printed graphene electrodes, according to an embodiment of the present invention.

As demonstrated by the foregoing exemplary embodiments of the invention, inkjet-printed graphene has properties useful in fabricating electrical components having high capacitance. A schematic of an exemplary embodiment of a supercapacitor 36 having inkjet-printed graphene electrodes 38, 40 is presented in FIG. 13. Referring to FIG. 13, graphene electrodes 38, 40 are inkjet-printed on the surface 42 of an electrically insulating material 44 (e.g., Kapton® polyimide membrane) in a cross-finger, interdigitated configuration. Polymeric membranes are often hydrophobic, and may resist adhesion of the water-based graphene oxide ink disclosed herein. In such cases, the membrane may be pretreated to improve the adhesion and wetting behavior of the ink droplets. For example, the Kapton® polyimide membrane may be pretreated with a caustic reagent (e.g., KOH solution) to improve adhesion and wetting behavior of the ink. Current collectors 46, 48 may also be applied to the surface 42 in electrical contact with the electrodes 38, 40. The current collectors 46, 48 are formed from an electrically-conductive material (e.g. silver (Ag)) and may be applied as a suspension of nanoparticles. Suitable suspensions are commercially available for this purpose. A quantity of electrolyte 50 is applied to the electrodes 38, 40 and enclosed by a hermetic seal 52. A suitable seal may be formed from a polymeric membrane (e.g., Kapton® FN polyimide film, E.I. duPont de Nemours and Company, USA) that is heat-sealed to the electrically-insulating material 44. Adhesive bonding (e.g., by soft-lithographic techniques) may also form a suitable seal. The materials used for the supercapacitor 36 must be electrochemically compatible with each other. Methods of selecting suitable materials will be known to those having ordinary skill in the design of electrochemical devices, who are given the present disclosure.

Electronic components, such as the supercapacitor discussed above, will generally be mechanically flexible, with the flexibility limited primarily by the structure encapsulating the electrodes. The graphene electrodes are thin and durable, and flex readily without losing their structural integrity. They can be printed on or conformed to surfaces other than those that are flat.

By modifying the inkjet printing conditions, the morphology and properties of the printed electrodes can be tailored for applications other than supercapacitors. For example, at a resolution of 50 μm, inkjet-printing can be used to create a conductive spiral that mimics the two-dimensional ("2D") induction coils used in wireless transmitting technology.

Transparent inkjet-printed graphene films can be made for use in solar cells and optoelectronic devices as substitutes for conventional transparent materials such as indium tin oxide.

If ink droplets are overlapped to form a single printed layer thin film without building up thickness of the printed pattern, graphene structures are formed that are transparent and electrically conductive. By varying the degree of overlap, which is a result of droplet size and spacing, and the thickness of the printed structure, which can be controlled by the number of printed layers, the properties of the thin graphene film can be tailored for different purposes. Data showing the result of varying droplet spacing on the sheet resistance and transparency of five printed-layered films are presented in Table 4, below.

TABLE 4

Effect of Droplet Spacing on the Properties of a 5 printed-layered Graphene Film

| Droplet Spacing (μm) | Sheet Resistance (MΩ/□) | Transparency (%) |
|---|---|---|
| 20 | 0.3 | 78 |
| 30 | 3.1 | 85 |
| 40 | 5.5 | 93 |

It should be understood that the embodiments of the invention described herein are merely exemplary and that a person skilled in the art may make many variations and modifications without departing from the spirit and scope of the invention. All such variations and modifications are intended to be included within the scope of the invention as defined in the appended claims.

We claim:

1. An electrical component, comprising an inkjet-printed electrode on a flexible substrate, said electrode including a plurality of overlapping dot-like structures which include graphene flakes, wherein said plurality of dot-like structures is distributed in said electrode such that said electrode has a transparency of at least about 80 percent.

2. An electrical component, comprising an inkjet-printed electrode on a flexible substrate, said electrode including a plurality of overlapping dot-like structures which include graphene flakes, wherein said electrode is a first electrode, said electrical component further comprising a second inkjet-printed electrode on a second flexible substrate, said second electrode including a plurality of overlapping dot-like structures which include graphene flakes, said first and second electrodes being separated from each other by an electrically-insulating membrane.

3. An electrical component, comprising an inkjet-printed electrode on a flexible substrate, said electrode including a plurality of overlapping dot-like structures which include graphene flakes, further comprising a second inkjet-printed electrode on said substrate, said second electrode including a plurality of overlapping dot-like structures which include graphene flakes, said substrate being an electrically-insulating substrate and said first and second electrodes being spaced apart by a distance from each other.

4. An electrical component, comprising an inkjet-printed electrode on a flexible substrate, said electrode including a plurality of overlapping dot-like structures which include graphene flakes, wherein said electrode is fabricated by a process including the steps of depositing graphene oxide flakes onto said flexible substrate, and then reducing at least some of said deposited graphene oxide to graphene.

5. The electrical component of claim 4, wherein said graphene oxide flakes are deposited onto said flexible substrate in droplets of a water-based graphene oxide ink so as to form said overlapping dot-like structures in a predetermined pattern, said dot-like structures including said graphene oxide flakes.

6. The electrical component of claim 4, wherein said depositing step is performed so as to build said electrode to a desired thickness.

7. The electrical component of claim 4, wherein said reducing step is performed at a temperature in the range of about 140° C. to about 800° C. under an inert atmosphere for a period of time in the range of about 4 hours to about 12 hours.

8. The electrical component of claim 4, wherein said reducing step is performed by means of a source of infrared radiation.

9. A double-layer capacitor, comprising
 a first inkjet-printed electrode including a first plurality of overlapping dot-like structures which include graphene flakes;
 a second inkjet-printed electrode including a second plurality of overlapping dot-like structures which include graphene flakes; and
 an electrically-insulating, ionically conducting material separating said first and second electrodes.

* * * * *